United States Patent
Tseng et al.

(10) Patent No.: US 11,037,886 B2
(45) Date of Patent: Jun. 15, 2021

(54) SEMICONDUCTOR STRUCTURE OF WORK UNIT MODULE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Li-Ya Tseng, Hsinchu (TW); Wei-Cheng Yu, Hsinchu (TW); Bo-Yan Li, Hsinchu (TW); Wen-Tai Wang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 18 days.

(21) Appl. No.: 16/705,253

(22) Filed: Dec. 6, 2019

(65) Prior Publication Data
US 2021/0050304 A1 Feb. 18, 2021

(30) Foreign Application Priority Data
Aug. 13, 2019 (TW) .................. 108128785

(51) Int. Cl.
*H01L 23/552* (2006.01)
*H01L 21/762* (2006.01)

(52) U.S. Cl.
CPC .......... *H01L 23/552* (2013.01); *H01L 21/762* (2013.01)

(58) Field of Classification Search
CPC ............. H01L 23/552; H01L 21/762; H01L 23/49894; H01L 21/823878; H01L 2027/11829–11833; H01L 2027/1189–11892; H01L 27/0207–0211
See application file for complete search history.

(56) References Cited

U.S. PATENT DOCUMENTS

| | | | |
|---|---|---|---|
| 9,627,529 B1* | 4/2017 | Tang | H01L 28/00 |
| 2002/0084490 A1* | 7/2002 | Ker | H01L 27/0292 257/355 |
| 2016/0181195 A1* | 6/2016 | Kim | H01L 23/49816 257/668 |
| 2016/0211290 A1* | 7/2016 | Tsai | H01L 27/1464 |
| 2016/0372495 A1* | 12/2016 | Wang | H01L 27/124 |
| 2020/0105739 A1* | 4/2020 | Yang | G06F 30/392 |
| 2020/0408907 A1* | 12/2020 | Ostby | G01S 3/784 |

* cited by examiner

*Primary Examiner* — Shahed Ahmed
(74) *Attorney, Agent, or Firm* — CKC & Partners Co., LLC

(57) ABSTRACT

A semiconductor structure of a work unit module includes an encircling noise-resistance structure and a P-type substrate being defined with a chip region and a surrounding region surrounding the chip region. The surrounding area includes two first strip regions and two second strip regions. Each of the first strip regions is located between the second strip regions, and each of the second strip regions is located between the first strip regions. The encircling noise-resistance structure is located on the surrounding area, and includes first arrangement units and second arrangement units. The first arrangement unit is arranged in one of the first strip regions in a single row. The second arrangement unit is arranged in one of the second strip regions in a single row, and the long axis direction of the second arrangement unit is different from the long axis direction of the first arrangement unit.

15 Claims, 6 Drawing Sheets

SEMICONDUCTOR STRUCTURE OF WORK UNIT MODULE

RELATED APPLICATIONS

This application claims priority to Taiwan Application Serial Number 108128785, filed Aug. 13, 2019, which is herein incorporated by reference.

BACKGROUND

Field of Disclosure

The disclosure relates to a semiconductor structure. More particularly, the disclosure relates to a semiconductor structure of a work unit module.

Description of Related Art

With the development of semiconductor technology, a conventional communication circuit module includes a main chip and a plurality of work units (e.g., serializer/deserializer, serdes). The main chip is surrounded by the work units. A noise isolation structure is placed to surround a periphery of each of the work units for isolating or at least reducing noise interference.

However, since the arrangement characteristics of each of the noise isolation structures are too consistent to protect the entire range of the corresponding working unit so that external electromagnetic waves (e.g., noises) pass through one of sides of the noise isolation structure to reach the working unit in a specific direction, thereby damaging and affecting the normal work of the work unit.

SUMMARY

In one embodiment of the disclosure, a semiconductor structure of a work unit module is provided, and the semiconductor structure includes a P-type substrate and an encircling noise-resistance structure. The P-type substrate is defined with a chip region and a surrounding region. The chip region is used to be mounted with a working chip thereon. The surrounding region surrounds the chip region, and the surrounding region includes two first strip regions which are opposite to each other, and two second strip regions which are opposite to each other. Each of the first strip regions is disposed between the second strip regions, and each of the second strip regions is disposed between the first strip regions. The encircling noise-resistance structure is located on the surrounding area to surround the chip region. The encircling noise-resistance structure includes a plurality of first sequence elements and a plurality of second sequence elements. The first sequence elements are separately arranged on one of the first strip regions abreast. Each of the first sequence elements is in parallel with one of the first strip regions, and each of the first sequence elements includes a plurality of first arrangement units which are arranged in a single row. Each of the first arrangement units includes a first oxide diffusion (OD) unit having a first long axis direction. The second sequence elements are separately arranged on one of the second strip regions abreast. Each of the second sequence elements is in parallel with one of the second strip regions. Each of the second sequence elements includes a plurality of second arrangement units which are arranged in a single row. Each of the second arrangement units includes a second oxide diffusion (OD) unit having a second long axis direction that is different from the first long axis direction of the first OD unit.

Thus, through the construction of the embodiments above, when external electromagnetic waves (e.g., noises) pass through the encircling noise-resistance structure in a specific direction, since the impedance of the encircling noise-resistance structure is increased because of the arrangements of the first arrangement units and the second arrangement units, the damage of the external electromagnetic waves (e.g., noises) to the working chip is reduced so as to decrease the possibility of affecting the working chip in normal operation.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
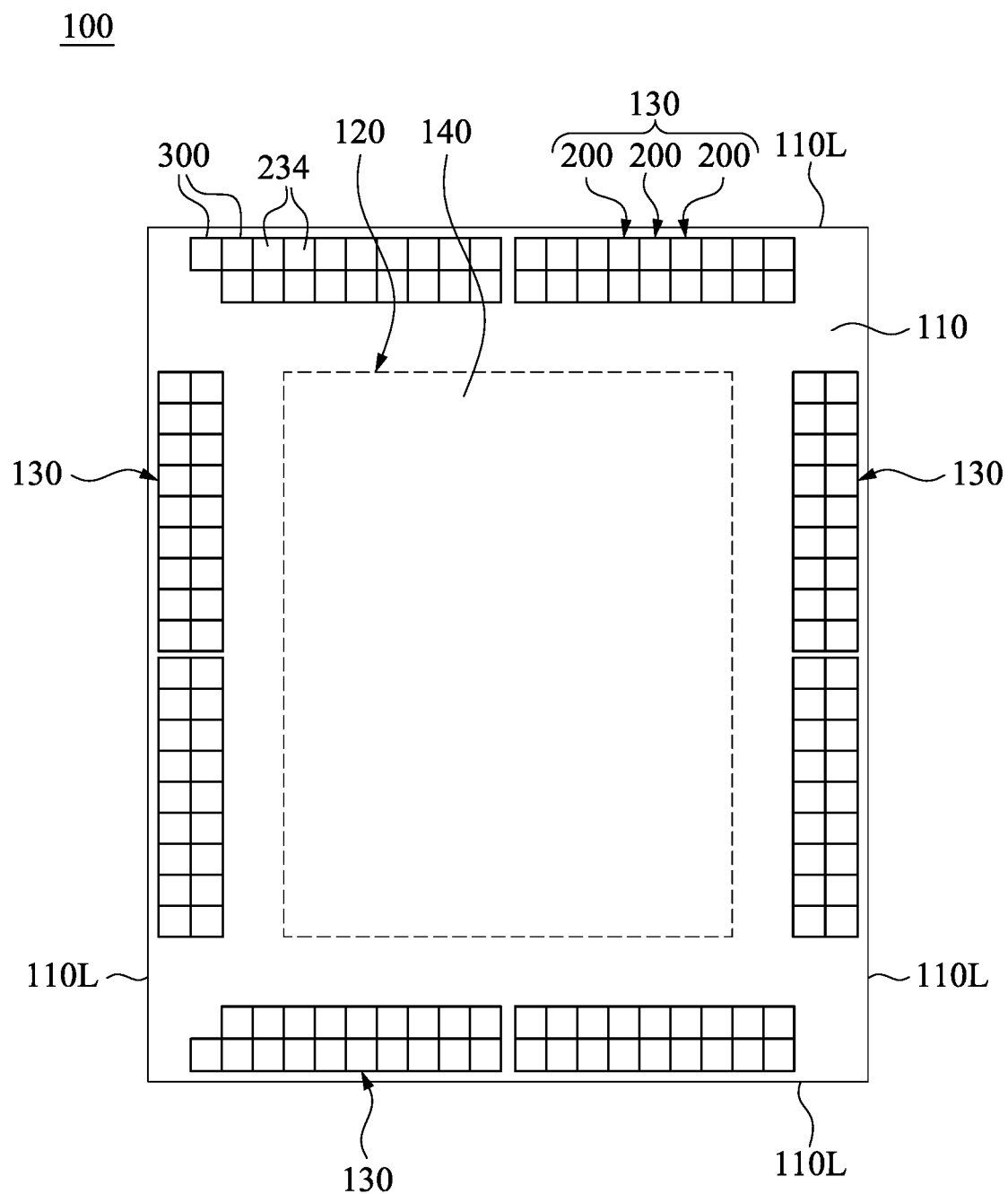
FIG. 1 is a layout arrangement view of a communication circuit module according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Reference is now made to FIG. 1, in which FIG. 1 is a layout arrangement view of a communication circuit module 100 according to one embodiment of the disclosure. As shown in FIG. 1, in this embodiment, a high speed communication product includes a configuration plane 110. The configuration plane 110 is defined with a central working area 120 and four chipsets 130. The central work area 120 is used to be mounted with a main chip 140 thereon. The chipsets 130 are respectively located on the four sides 110L of the configuration plane 110. Each of the chipsets 130 includes a plurality of work unit modules 200. The work unit modules 200 are arranged on one of the sides 110L of the configuration plane 110 according to an array pattern (for example, 2*N). The configuration plane 110 is, for example, a print circuit board or a wiring board etc.

Figure 2:
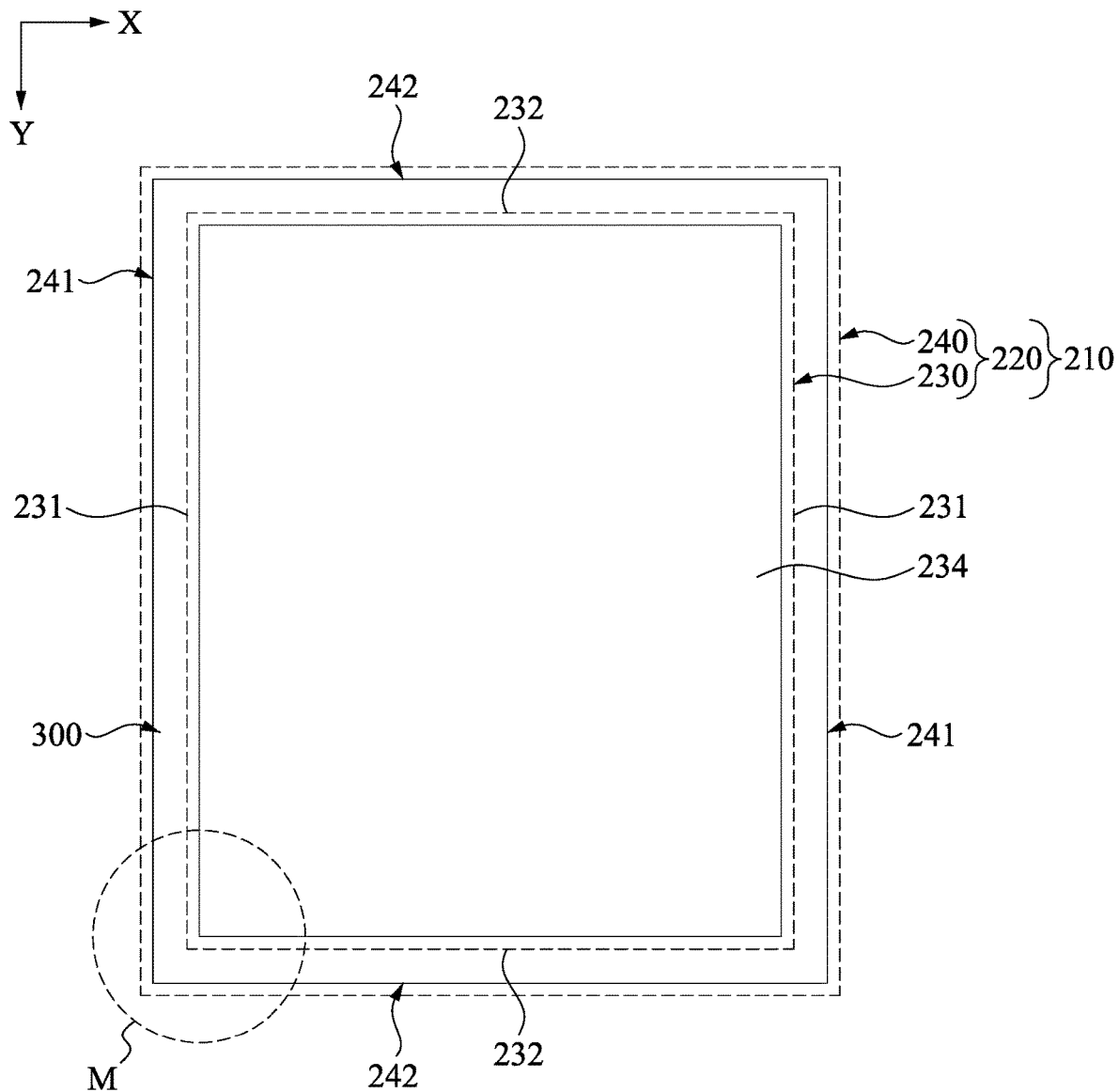
FIG. 2 is a schematic front view of one of work unit modules of FIG. 1.
Figure 3:
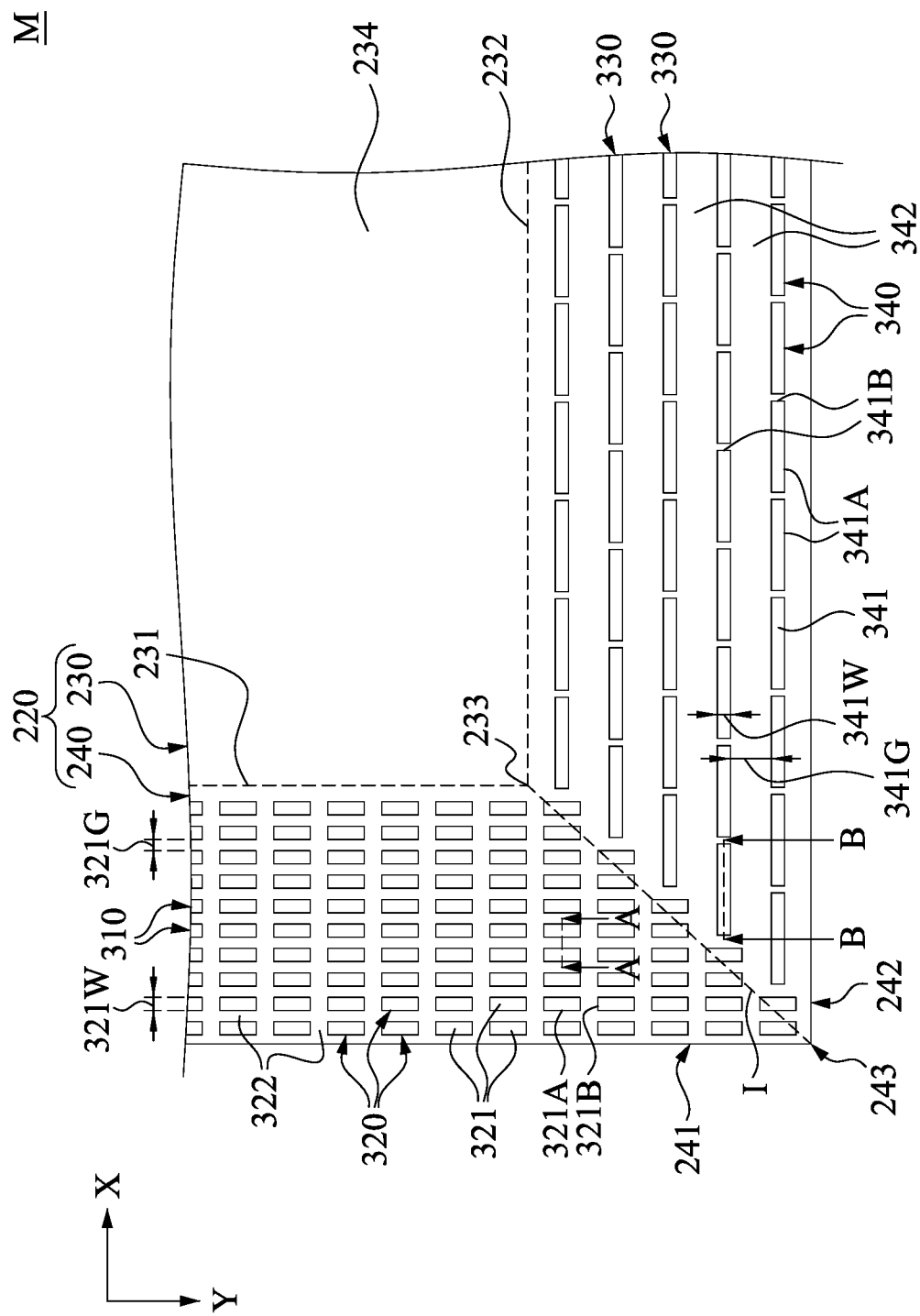
FIG. 3 is a partial enlarging view of a region M of FIG. 2.

FIG. 2 is a schematic front view of one of work unit modules 200 of FIG. 1. FIG. 3 is a partial enlarging view of a region M of FIG. 2. As shown in FIG. 2 and FIG. 3, in this embodiment, each of the semiconductor structures for the work unit module 200 includes a P-type substrate 210 and an encircling noise-resistance structure 300. One front surface 220 of the P-type substrate 210 is defined with a chip region 230 and a surrounding region 240. The chip region 230 is used to be mounted with a working chip 234 thereon. For example, the working chip 234 is a serializer/deserializer (serdes), and the working chip 234 is a dual-core model. The surrounding region 240 surrounds the chip region 230. The encircling noise-resistance structure 300 is located at the surrounding region 240 to surround the chip region 230.

For example, the chip region 230 is shaped in a rectangle, and the rectangle is formed with two first side edges 231 (i.e., the left and right sides of the rectangle) and two second side edges 232 (i.e., the top and bottom sides of the rectangle). The two first side edges 231 are opposite to each other, and each of the two first side edges 231 is located between the two second side edges 232 to abut the two second side edges 232. The two second side edges 232 are arranged opposite to each other, and each of the two second side edges 232 is located between the two first side edges 231 to abut the two first side edges 231. A front side 220 of the P-type substrate 210 also is rectangular, and the chip region 230 is located at the center of the front side 220 of the P-type substrate 210. The surrounding region 240 is shaped as a frame to completely surround the chip region 230. The surrounding region 240 includes two first strip regions 241 (i.e., the vertical portions of the surrounding area 240) which are opposite to each other, and two second strip regions (i.e., the horizontal portions of the surrounding area 240) which are opposite to each other. Each of the first strip regions 241 and each of the second strip regions 242 are orthogonal with each other. Each of the first strip regions 241 is disposed between the second strip regions 242, and abuts one of the first side edges 231 of the chip region 230. Each of the second strip regions 242 is disposed between the first strip regions 241, and abuts one of the second side edges 232 of the chip region 230. Each of the first strip regions 241 extends in the Y-axis direction, and each of the second strip regions 242 extends in the X-axis direction. However, the disclosure is not limited thereto.

The encircling noise-resistance structure 300 is used to isolate or at least reduce the noise interference. The encircling noise-resistance structure 300 includes a plurality of first sequence elements 310 and a plurality of second sequence elements 330. The first sequence elements 310 are separately arranged on one of the first strip regions 241 abreast. Each of the first sequence elements 310 is in parallel with one of the first strip regions 241, in other words, the long axis direction (e.g., Y-axis direction) of each of the first sequence elements 310 is parallel to the long axis direction (e.g., Y-axis direction) of each of the first strip regions 241. Each of the first sequence elements 310 includes a plurality of first arrangement units 320 which are arranged in a single row. For example, the first arrangement units 320 of each of the first sequence elements 310 are equally-spaced arranged one on one in the Y-axis direction. However, the number of the first arrangement units 320 of these first sequence elements 310 may be not equal. Each of the first arrangement units 320 includes a first oxide diffusion (OD) unit 321 having a first long axis direction (e.g., Y-axis direction). Exemplarily, each of the first OD units 321 is in a rectangular shape, and the length of the side 321A of the first OD unit 321 in the Y-axis direction is greater than the length of the side 321B of the first OD unit 321 in the X-axis direction (that is, width 321W). More specifically, a spacing 321G is formed between any two adjacent ones of the first sequence elements 310, and the spacing 321G is not greater than the width 321W. The spacing 321G is, for example, 0.588 micrometers.

The second sequence elements 330 are separately arranged on one of the second strip regions 242 abreast. Each of the second sequence elements 330 is in parallel with one of the second strip regions 242, in other words, the long axis direction (e.g., X-axis direction) of each of the second sequence elements 330 is parallel to the long axis direction (e.g., X-axis direction) of each of the second strip regions 242. Each of the second sequence elements 330 includes a plurality of second arrangement units 340 which are arranged in a single row. For example, the second arrangement units 340 of each of the second sequence elements 330 are equally-spaced arranged one on one in the X-axis direction. However, the number of the second arrangement units 340 of these second sequence elements 330 may be not equal. Each of the second arrangement units 340 includes a second oxide diffusion (OD) unit 341 having a second long axis direction different from the first long axis direction. For example, the second long axis direction is X-axis direction so that the second long axis direction is orthogonal to the first long axis direction (e.g., Y-axis direction). Exemplarily, each of the second OD units 341 is in a rectangular shape, and the length of the side 341A of the second OD unit 341 in the X-axis direction is greater than the length of the side 341B of the second OD unit 341 in the X-axis direction (that is, width 341W). Each of the second OD unit 341 is greater than one of the first OD units 321 in length, in other words, a side length of each of the second OD unit 341 in the X-axis direction is greater than a side length of each of the first OD unit 321 in the Y-axis direction. More specifically, a spacing 341G is formed between any two adjacent ones of the second sequence elements 330, and the spacing 341G is 2 to 3 times the width 341W.

Thus, when external electromagnetic waves (e.g., noises) pass through the first sequence elements 310 of the encircling noise-resistance structure 300 in the X-axis direction, since the first arrangement units 320 of the first sequence elements 310 are discontinuously arranged, and each of the first arrangement units 320 of the first sequence elements 310 is parallel to the first side edge 231 (e.g., Y-axis direction) of the chip region 230, so that the impedance of the first sequence elements 310 is greatly increased, thereby slowing down the transfer speed of the external electromagnetic waves (e.g., noises). Similarly, when external electromagnetic waves (e.g., noises) pass through the second sequence elements 330 of the encircling noise-resistance structure 300 in the Y-axis direction, since the second arrangement units 340 of the second sequence elements 330 are discontinuously arranged, and each of the second arrangement units 340 of the second sequence elements 330 is parallel to the second side edge 232 (e.g., X-axis direction) of the chip region 230, so that the impedance of the second sequence elements 330 is greatly increased, thereby slowing down the transfer speed of the external electromagnetic waves (e.g., noises), so as to reduce the possibility of affecting the working chip 234 in normal operation.

It is noted, as long as the first long axis direction of the first OD unit 321 or the second long axis direction of the second OD unit 341 does not pass through the chip region 230, the external electromagnetic waves (e.g., noises) will not be guided to the working chip 234 in the chip region 230 quickly, so as to reduce the possibility of affecting the working chip 234 in normal operation.

Furthermore, in the embodiment, the first OD units 321 of any of the first sequence elements 310 and the first OD units 321 of the neighboring one of the first sequence elements 310 are aligned with each other. However, the disclosure is not limited thereto. In other embodiments, these first OD units 321 of the adjacent two first sequence elements 310 may be alternately arranged in a staggered manner according to requirements or limitations. In a similar way, in the embodiment, the second OD units 341 of any of the second sequence elements 330 and the second OD units 341 of the neighboring one of the second sequence elements 330 are alternately arranged in a staggered manner. However, the disclosure is not limited thereto. In other embodiments, these second OD units 341 of the adjacent two second sequence elements 330 may be modified to be aligned with each other according to requirements or limitations.

Figure 4A:
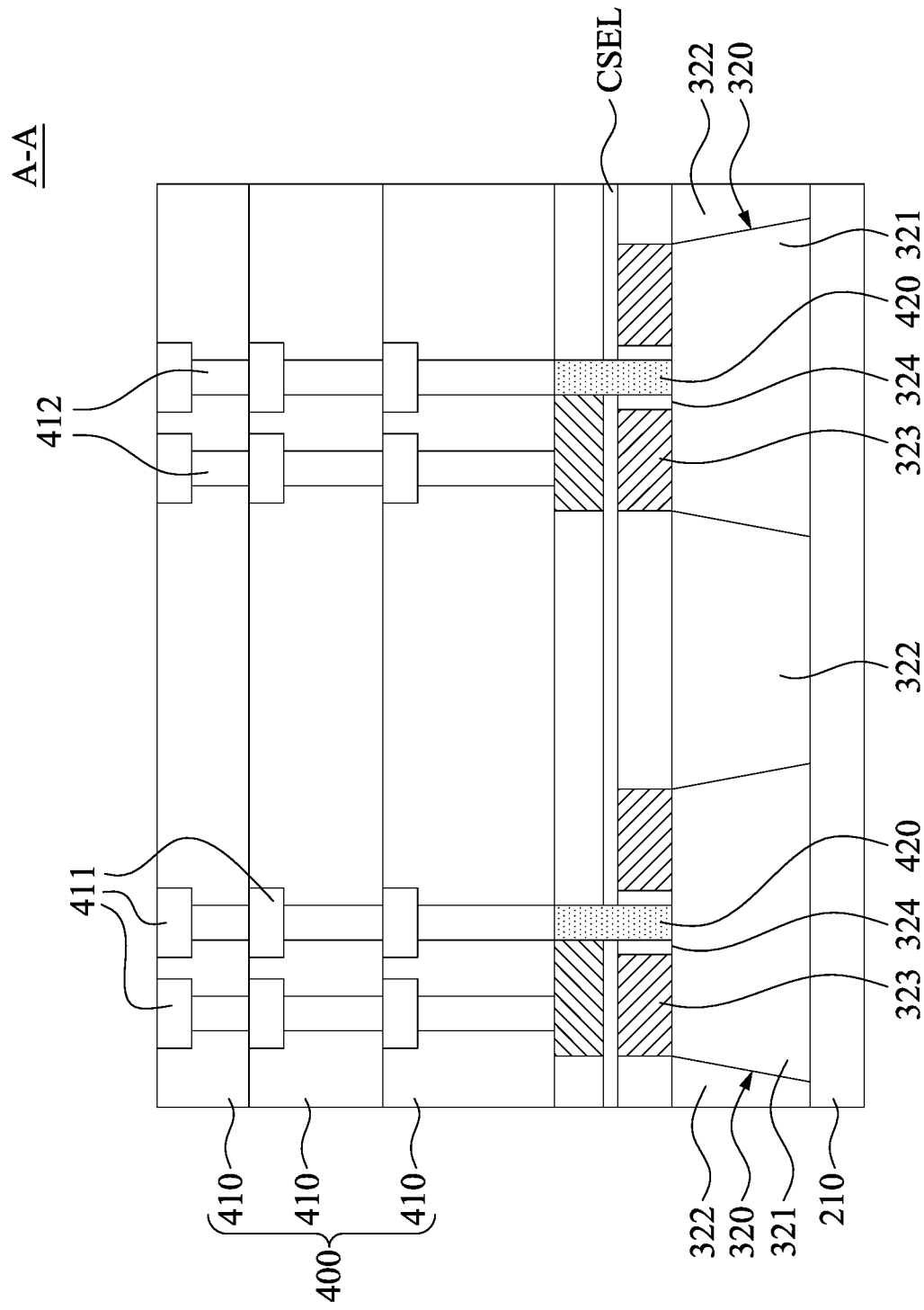
FIG. 4A is a partial cross-sectional view taken along a line A-A of FIG. 3.

Reference is now made to FIG. 4A, in which FIG. 4A is a partial cross-sectional view taken along a line A-A of FIG. 3. In the embodiment, as shown in FIG. 3 and FIG. 4A, the encircling noise-resistance structure 300 further includes a plurality of first shallow trench isolation (STI) structures and a plurality of second shallow trench isolation (STI) structures. Each of the first STI structures 322 is formed between any two adjacent ones of the first OD units 321. The impedance of each of the first STI structures 322 is greater than the impedance of one of the first OD units 321. More particularly, each of the first STI structures 322 is located between any two adjacent ones of first OD units 321 of the same first sequence elements 310, or between any two adjacent ones of the first sequence elements 310.

Figure 4B:
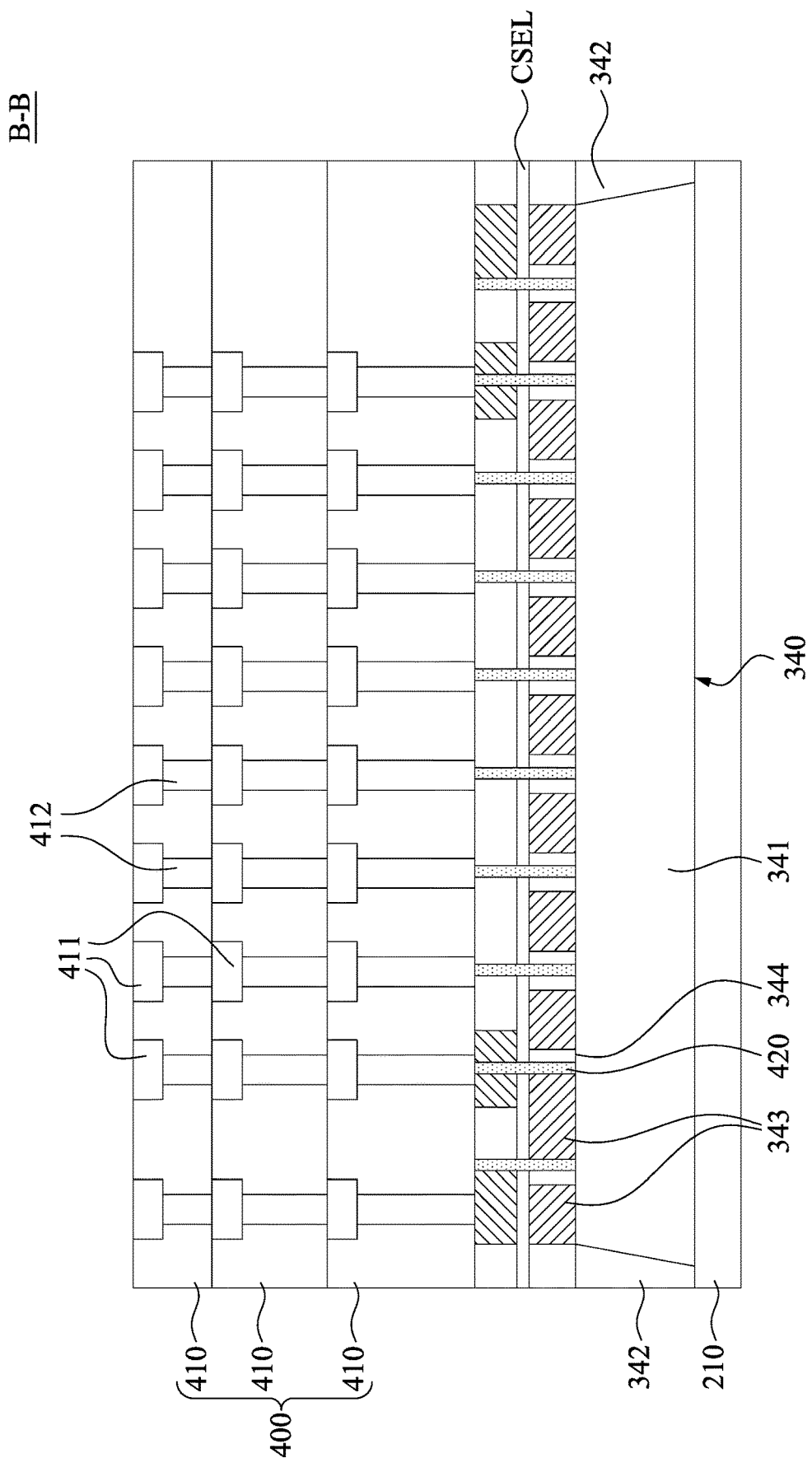
FIG. 4B is a partial cross-sectional view taken along a line B-B of FIG. 3.

FIG. 4B is a partial cross-sectional view taken along a line B-B of FIG. 3. As shown in FIG. 3 and FIG. 4B, each of the second STI structures 342 is formed between any two adjacent ones of the second OD units 341. More particularly, each of the second STI structures 342 is located between any two adjacent ones of second OD units 341 of the same second sequence elements 330, or between any two adjacent ones of the second sequence elements 330. The impedance of each of the second STI structures 342 is greater than the impedance of one of the second OD units 341.

Therefore, since the first STI structures 322 and the first OD units 321 which are adjacent to each other are designed to be in parallel with each other, and the impedance of the first STI structure 322 is greater than the impedance of the first OD unit 321, the external electromagnetic waves (e.g., noises) will be guided to the chip region 230 from the first OD units 321 in the X-axis direction, rather than from the first STI structure 322. Thus, the transmission paths of the external electromagnetic waves (e.g., noises) to the chip region 230 in the X-axis direction are greatly reduced. In a similar way, in the embodiment, since the second STI structures 342 and the second OD units 341 which are adjacent to each other are designed to be in parallel with each other, the impedance of the second STI structure 342 is greater than the impedance of the second OD unit 341, thus the external electromagnetic waves (e.g., noises) will be guided to the chip region 230 from the second OD units 341 in the Y-axis direction, rather than from the second STI structure 342. Thus, the transmission paths of the external electromagnetic waves (e.g., noises) to the chip region 230 in the Y-axis direction are greatly reduced.

As shown in FIG. 4A and FIG. 4B, the semiconductor structure further includes a metal layer 400. The metal layer 400 is disposed on the P-type substrate 210 above. The encircling noise-resistance structure 300 is interposed between the P-type substrate 210 and the metal layer 400. More specifically, as shown in FIG. 4A, the metal layer 400 is a collective term for a plurality of sub-layer portions 410 which are stacked with each other. Each of the sub-layer portions 410 includes a layer body 413, a contact 411 and a via portion 412. The via portion 412 of one of the sub-layer portions 410 penetrates through the layer body 413 to connect the contact 411 of the sub-layer portion 410 and another contact 411 of the adjacent sub-layer portion 410.

Each of the first arrangement units 320 is further provided with a plurality of first dummy gates 323 and a first silicide layer 324. Each of the first dummy gates 323 is disposed between the metal layer 400 and one of the first OD units 321. More particularly, the first dummy gates 323 are spaced apart from one side of the first OD unit 321, and the first dummy gates 323 are electrically insulated from the metal layer 400. The first silicide layer 324 is formed on the remaining area of the first OD unit 321 except the first dummy gate 323. The metal layer 400 is electrically connected to the first silicide layer 324 through a conductive portion 420. Thus, since the first dummy gates 323 are disposed on the first OD unit 321, the maximum configuration area of the first silicide layer 324 is reduced, thereby reducing the transmission capability of the first OD unit 321 to the metal layer 400. Therefore, the possibility of affecting the working chip (not shown) in normal operation is reduced.

Each of the second arrangement units 340 is further provided with a plurality of second dummy gates 343 and a second silicide layer 344. Each of the second dummy gates 343 is disposed between the metal layer 400 and one of the second OD units 341. More particularly, the second dummy gates 343 are spaced apart from one side of the second OD unit 341, and the second dummy gates 343 are electrically insulated from the metal layer 400. The second silicide layer 344 is formed on the remaining area of the second OD unit 341 except the second dummy gate 343. The metal layer 400 is electrically connected to the second silicide layer 344 through plural another conductive portions 420. In a similar way, since the second dummy gates 343 are disposed on the second oxide diffusion unit 341, the maximum arrangement area of the second metal silicide layer 344 is reduced, thereby reducing the transmission capability of the second OD unit 341 to the metal layer 400. Therefore, the possibility of affecting the working chip (not shown) in normal operation is reduced.

Also, the semiconductor structure further includes a contact etch stop layer (CESL). A contact etch stop layer (CESL) is located between the metal layer 400 and the first OD unit 321, and between the metal layer 400 and the second OD unit 341. The contact etch stop layer (CESL) is in contact with the contact etch stop Layer (CESL), is electrically insulated from the conduction of the metal layer 400 and the first dummy gate 323, and is electrically insulated from the conduction of the metal layer 400 and the second dummy gate 343.

Back to FIG. 3, in the embodiment, one junction of one of the first strip regions 241 and one of the second strip regions 242 is provided with a corner region 243. More specifically, the corner region 243 is the position having an imaginary line I directed from a corner (i.e., the intersection 233 of the left and lower side edges 231, 232 of the rectangle) of the chip region 230 to a corner 243 (i.e., the intersection of the left and lower side edges of the P-type substrate) of the P-type substrate 210.

Since the external electromagnetic waves (i.e., noise) are spread with radial movement, a part of the external electromagnetic waves (e.g., noises) which does not move in either the X-axis direction or Y-axis direction may be possible to affect the working chip (not shown) through the encircling noise-resistance structure 300 with radial movement. Thus, in the embodiment, only the first OD units 321 are disposed in the corner region 243. For example, only the last one of the first OD units 321 of each first sequence element 310 is disposed in the corner region 243. However, the disclosure is not limited thereto. In other embodiments, it also can be modified that only the second OD units 341 are disposed in the corner region 243, or both of the first OD units 321 and the second OD units 341 may be located in the corner region 243.

Figure 5:
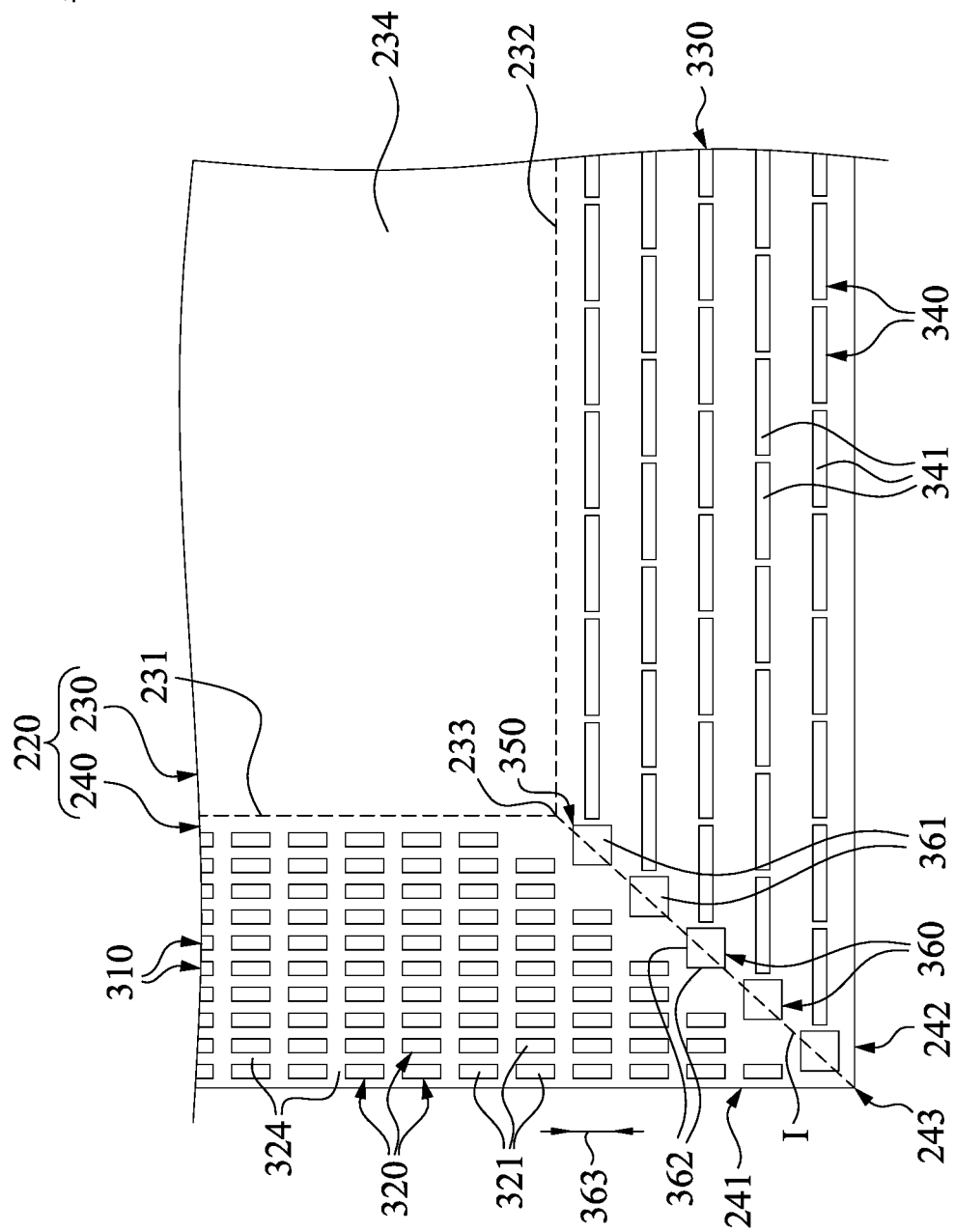
FIG. 5 is a partial schematic view of a work unit module according to one embodiment of the disclosure.

FIG. 5 is a partial schematic view of a work unit module 201 according to one embodiment of the disclosure. As shown in FIG. 5, the work unit module 201 of FIG. 5 and the work unit module 200 of FIG. 3 are substantially the same, except that the encircling noise-resistance structure 300 includes at least one third sequence element 350 that is located at the corner region 243. The long axis direction (i.e., imaginary line I) of the third sequence element intersects with the long axis direction of the first strip region 241. The third sequence element 350 includes a plurality of third arrangement units 360 which are separately arranged in a single row. Each of the third arrangement units 360 includes a third oxide diffusion (OD) unit 361, and the third oxide diffusion (OD) unit 361 is different from the aforementioned first OD unit 321 and the aforementioned second OD unit 341 in size. Exemplarily, a side length (i.e., short side length) of each third OD unit 361 is between the side length (width) of the second OD unit 341 in the Y-axis direction and the side length of the first OD unit 321 in the Y-axis direction (i.e., long side length).

More specifically, each of the third OD units 361 is in square, such that two adjacent side edges 362 of each of the third OD units 361 are substantially the same. Thus, since the length of the side 362 of each third OD unit 361 is less than the length of the side of each first OD unit 321 and the length of each second OD unit 341, it is also possible to prevent the external electromagnetic waves (e.g., noises) moving along the direction of the imaginary line I from passing through the encircling noise-resistance structure 300 quickly to affect the operation of the working chip (not shown).

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A semiconductor structure of a work unit module, comprising:
a P-type substrate defined with a chip region used to be mounted with a working chip thereon, and a surrounding region surrounding the chip region, the surrounding region comprising two first strip regions which are opposite to each other, and two second strip regions which are opposite to each other, and each of the first strip regions is disposed between the second strip regions, and each of the second strip regions is disposed between the first strip regions; and
an encircling noise-resistance structure located on the surrounding area to surround the chip region, and the encircling noise-resistance structure comprising:
a plurality of first sequence elements separately arranged on one of the first strip regions abreast, each of the first sequence elements being in parallel with one of the first strip regions, and each of the first sequence elements comprising a plurality of first arrangement units which are arranged in a single row, and each of the first arrangement units comprising a first oxide diffusion (OD) unit having a first long axis direction; and
a plurality of second sequence elements separately arranged on one of the second strip regions abreast, each of the second sequence elements being in parallel with one of the second strip regions, and each of the second sequence elements comprising a plurality of second arrangement units which are arranged in a single row, and each of the second arrangement units comprising a second oxide diffusion (OD) unit having a second long axis direction that is different from the first long axis direction of the first OD unit.

2. The semiconductor structure of the work unit module of claim 1, wherein each of the second long axis directions and each of the first long axis directions are orthogonal to each other, and
the one of the first strip regions and the one of the second strip regions are orthogonal to each other.

3. The semiconductor structure of the work unit module of claim 1, wherein the chip region is formed with a first side edge and a second side edge which are adjacent to each other, and
the one of the first strip regions abuts the first side edge of the chip region, and the one of the second strip region abuts the second side edge of the chip region.

4. The semiconductor structure of the work unit module of claim 1, wherein the first OD units of the first sequence elements are staggered or aligned with each other.

5. The semiconductor structure of the work unit module of claim 1, wherein the second OD units of the second sequence elements are staggered or aligned with each other.

6. The semiconductor structure of the work unit module of claim 1, wherein the encircling noise-resistance structure further comprises:
a plurality of first shallow trench isolation (STI) structures in which each of the first STI structures is formed between any two adjacent ones of the first OD units, and an impedance of each of the first STI structures is greater than an impedance of each of the first OD units.

7. The semiconductor structure of the work unit module of claim 6, wherein the encircling noise-resistance structure further comprises:
a plurality of second shallow trench isolation (STI) structures in which each of the second STI structures is formed between any two adjacent ones of the second OD units, and an impedance of each of the second STI structures is greater than an impedance of each of the second OD units.

8. The semiconductor structure of the work unit module of claim 1, wherein each of the first OD units is provided with a first width, and a first spacing is formed between any two adjacent ones of the first sequence elements, and the first spacing is not greater than the first width.

9. The semiconductor structure of the work unit module of claim 1, wherein each of the second OD units is provided with a second width, and a second spacing is formed between any two adjacent ones of the second sequence elements, and the second spacing is 2 to 3 times the second width.

10. The semiconductor structure of the work unit module of claim 1, wherein each of the second OD units is greater than each of the first OD units in length.

11. The semiconductor structure of the work unit module of claim 1, further comprising:
- a metal layer disposed on the P-type substrate, wherein the encircling noise-resistance structure is interposed between the P-type substrate and the metal layer,
- wherein each of the first arrangement units is further provided with at least one first dummy gate, the first dummy gate is located between the metal layer and one of the first OD units, and is electrically insulated from the metal layer.

12. The semiconductor structure of the work unit module of claim 11, wherein each of the second arrangement units is further provided with at least one second dummy gate, and the second dummy gate is located between the metal layer and one of the second OD units, and is electrically insulated from the metal layer.

13. The semiconductor structure of the work unit module of claim 1, wherein one junction of one of the first strip regions and one of the second strip regions is provided with a corner region, and
- at least one of the first OD unit and the second OD unit is located within one of the corner regions.

14. The semiconductor structure of the work unit module of claim 1, wherein one junction of one of the first strip regions and one of the second strip regions is provided with a corner region; and
- the encircling noise-resistance structure comprises at least one third sequence element that is located at the corner region, and a long axis direction of the third sequence element intersects with a long axis direction of the one of the first strip regions,
- the third sequence element comprises a plurality of third arrangement units separately arranged, each of the third arrangement units comprising a third oxide diffusion (OD) unit, a length of each of the third OD units is between a width of each of the second OD units and a length of each of the first OD units.

15. The semiconductor structure of the work unit module of claim 14, wherein two adjacent sides of each of the third OD units are substantially the same.

* * * * *